(12) United States Patent
Nagata

(10) Patent No.: US 8,500,967 B2
(45) Date of Patent: Aug. 6, 2013

(54) VACUUM ARC EVAPORATION APPARATUS AND METHOD, AND MAGNETIC RECORDING MEDIUM FORMED THEREBY

(75) Inventor: Naruhisa Nagata, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/172,272

(22) Filed: Jun. 29, 2011

(65) Prior Publication Data

US 2011/0256426 A1    Oct. 20, 2011

Related U.S. Application Data

(62) Division of application No. 10/886,943, filed on Jul. 8, 2004, now abandoned.

(30) Foreign Application Priority Data

Jul. 8, 2003    (JP) .................................. 2003-272059

(51) Int. Cl.
| | | |
|---|---|---|
| C23C 14/00 | (2006.01) | |
| C23C 14/32 | (2006.01) | |
| C25B 9/00 | (2006.01) | |
| C25B 11/00 | (2006.01) | |
| C25B 13/00 | (2006.01) | |

(52) U.S. Cl.
USPC ................................. 204/192.38; 204/298.41

(58) Field of Classification Search
USPC ........................................ 204/192.38, 298.41
See application file for complete search history.

(56) References Cited

U.S. PATENT DOCUMENTS

| | | |
|---|---|---|
| 5,269,898 A | 12/1993 | Welty |
| 5,277,714 A | 1/1994 | Tamagaki |
| 5,282,944 A | 2/1994 | Sanders et al. |
| 5,480,527 A | 1/1996 | Welty |
| 5,840,163 A | 11/1998 | Welty |
| 5,976,636 A | 11/1999 | Leu et al. |

(Continued)

FOREIGN PATENT DOCUMENTS

| | | |
|---|---|---|
| EP | 1 170 776 A2 | 1/2002 |
| EP | 1 189 258 A2 | 3/2002 |

(Continued)

OTHER PUBLICATIONS

Machine Translation JP11036063.*
Relevant portion of Australian Search Report for corresponding Australian Patent Application No. SG200404347-7, mailed Nov. 17, 2006.

*Primary Examiner* — Michael Band
(74) *Attorney, Agent, or Firm* — Rossi, Kimms & McDowell LLP

(57) ABSTRACT

In a vacuum arc evaporation apparatus, to stably maintain vacuum arc discharge at an arc source when depositing a cathode material on a substrate, namely a magnetic recording medium, an ungrounded anode of a coil-type tube is placed inside an arc source discharge vacuum chamber. A DC arc power supply is connected between the cathode and the anode to cause an arc current to flow in the anode to generate a first magnetic field in one direction, from the cathode toward the anode. A second magnetic field is generated in the opposite direction, from the anode to the cathode by feeding a specified current to an external coil positioned around the discharge chamber. The external coil includes an around-cathode coil and an around-anode coil. The arc discharge can be started by operating a striker to carry out the deposition.

15 Claims, 2 Drawing Sheets

U.S. PATENT DOCUMENTS

| | | |
|---|---|---|
| 6,315,877 B1 | 11/2001 | Goedicke et al. |
| 6,338,778 B1 | 1/2002 | Giersch et al. |
| 6,506,292 B2 | 1/2003 | Murakami et al. |
| 6,635,156 B1 | 10/2003 | Dodonov et al. |
| 6,855,237 B2 | 2/2005 | Kolpakov et al. |
| 6,936,145 B2 | 8/2005 | Sunthankar et al. |
| 2002/0007796 A1 | 1/2002 | Gorokhovsky |
| 2002/0020356 A1 | 2/2002 | Murakami |

FOREIGN PATENT DOCUMENTS

| | | | |
|---|---|---|---|
| JP | 11036063 A | * | 2/1999 |
| JP | 11080940 A | * | 3/1999 |
| JP | 2002-32907 A | | 2/2002 |
| JP | 2002-88466 A | | 3/2002 |
| JP | 2002-121660 A | | 4/2002 |

* cited by examiner

VACUUM ARC EVAPORATION APPARATUS AND METHOD, AND MAGNETIC RECORDING MEDIUM FORMED THEREBY

CROSS-REFERENCE

This is a division of application Ser. No. 10/886,943 filed 8 Jul. 2004, the entire disclosure of which is herein incorporated by reference.

BACKGROUND

A diamond-like carbon (DLC) film, formed of carbon, is suitable for a wear or abrasive resistant layer of a magnetic recording medium because it has an excellent surface smoothness and a high hardness. Such a hard coating has been typically formed via a sputtering method, a plasma CVD method, or a vacuum arc evaporation method. FIG. 1 illustrates an example of an arrangement of a filtered cathodic arc (FCA) evaporation apparatus currently used in a vacuum arc evaporation method.

In the example of the arrangement in FIG. 1, a cathode material plasma P is generated at an arc source Sa. With the use of a magnetic filter 10, the plasma P is guided as a cathode material plasma beam Pb to a substrate 13, which is held in a deposition vacuum chamber 14 having a shutter 19. The magnetic filter 10 has a stainless steel pipe 11 bent in a quarter circular-arc-shape as a core, on which an electromagnet coil 12 is provided. Between the magnetic filter 10 and the deposition vacuum chamber 14, a raster coil 18 is provided. With this arrangement, a film of cathode material ions can be formed on the substrate 13. When carbon (graphite) is used as the cathode material or target in the vacuum arc evaporation apparatus, the formed film has a tetrahedral amorphous carbon (ta-C) structure, containing no hydrogen, but rich in $sp^3$ bond carbon, with a high hardness.

At the arc source Sa in the above arrangement, with the deposition material taken as a cathode target 16, a vacuum arc discharge is induced between the cathode target 16 and an anode 17 by contacting a striker 15 with the surface of the cathode target 16 to thereby generate the cathode material plasma P. However, with this arrangement, it is difficult to stably maintain the arc discharge. Moreover, another problem is that a cathode spot of the discharge circumvents the cathode target 16, making it difficult to discharge the cathode material plasma beam Pb toward the desired direction.

Examples of an arrangement of the arc source Sa are disclosed in JP-A-2002-32907 and JP-A-2002-88466. To stably maintain arc discharge in the above arrangements, specialized arrangement of the arc source and the method of generating the arc discharge must be considered. Furthermore, in the arrangement disclosed in the latter reference, it is difficult to provide a cooling mechanism for the magnetic material.

Accordingly, there is a need for a vacuum arc evaporation apparatus or method provided with a vacuum arc discharge unit that can stably maintain vacuum arc discharge at an arc source. The present invention addresses this need.

SUMMARY OF THE INVENTION

The present invention relates to a vacuum arc evaporation apparatus, a vacuum arc evaporation method, and a magnetic recording medium formed thereby. In particular, to a vacuum arc evaporation apparatus and a vacuum arc evaporation method that can be used for forming a hard coating of a wear resistant material or an abrasive resistant material on a magnetic recording medium as an overcoat layer.

One aspect of the present invention is the vacuum arc evaporation apparatus. It can include a deposition vacuum chamber, a discharge unit, and a plasma unit. The discharge unit discharges an arc of an ungrounded cathode material or target to form a cathode-material plasma. The plasma guiding unit is disposed between the deposition vacuum chamber and the discharge unit and guides the cathode-material plasma to the deposition vacuum chamber by an induced magnetic field to deposit the cathode target on the substrate. The discharge unit can include an electrically grounded discharge vacuum chamber, which contains the ungrounded cathode target therein, a first generating unit provided inside the discharge vacuum chamber to generate a first magnetic field, and a second generating unit provided around the discharge vacuum chamber to generate a second magnetic field.

The ungrounded cathode target is positioned away from the plasma guiding unit and the first generating unit is positioned between the plasma guiding unit and the cathode target. The first magnetic field can extend substantially along a first direction, and the second magnetic field can extend substantially along a second direction, which is substantially opposite to the first direction. The first direction can extend substantially in a direction from the cathode target toward the first generating unit, and the second direction can extend substantially in the opposite direction of the first direction, namely from the first generating unit toward the cathode target.

The first generating unit can be an electrically ungrounded coiled or coil-type anode disposed along the inside of the discharge vacuum chamber, and the direction of the center axis of the coil-type anode can be substantially parallel with the direction from the cathode target to the first generating unit. The second generating unit can be a coil provided along the outside of the discharge vacuum chamber, and the direction of the center axis of the coil can be substantially parallel with the direction from the cathode target to the first generating unit.

The discharge vacuum chamber can have a tubular shape and can be provided with an insulating material between the inner surface of the discharge vacuum chamber and the first generating unit. The apparatus can include a cooling unit for preventing the cathode target, the first generating unit, and the discharge vacuum chamber from being overheated by the arc discharge.

The deposition material can be carbon. The substrate can include a magnetic recording layer. When the carbon is deposited on the magnetic recording layer, it forms an overcoat layer having a tetrahedral amorphous carbon structure with a high hardness.

Another aspect of the present invention is the method of depositing a film on to a substrate, with the above-described vacuum arc evaporation apparatus. The method comprises the steps of evacuating the deposition vacuum chamber containing the substrate, generating the cathode material plasma by arc discharging the cathode target with the discharge unit, and depositing the cathode target on the substrate by guiding the cathode material plasma to the deposition vacuum chamber with the plasma guiding unit.

Another aspect of the present invention is a magnetic recording medium formed by depositing the overcoat layer on the substrate with the magnetic layer according to the above-described method.

Another aspect of the present invention is a magnetic recording medium formed by the above-described apparatus.

DETAILED DESCRIPTION

The present vacuum arc evaporation apparatus can include a deposition vacuum chamber 14, a discharge unit Sa for discharging arc from a cathode target 2, which is made of a deposition material for depositing on a substrate disposed in the deposition vacuum chamber, and a plasma guiding unit 10 disposed between the deposition vacuum chamber and the discharge unit for guiding the cathode material plasma generated by the arc discharge to the deposition vacuum chamber by an induced magnetic field, which can be generated by feeding a current to a coil of the plasma guiding unit, to deposit the cathode target on the substrate.

Figure 2:
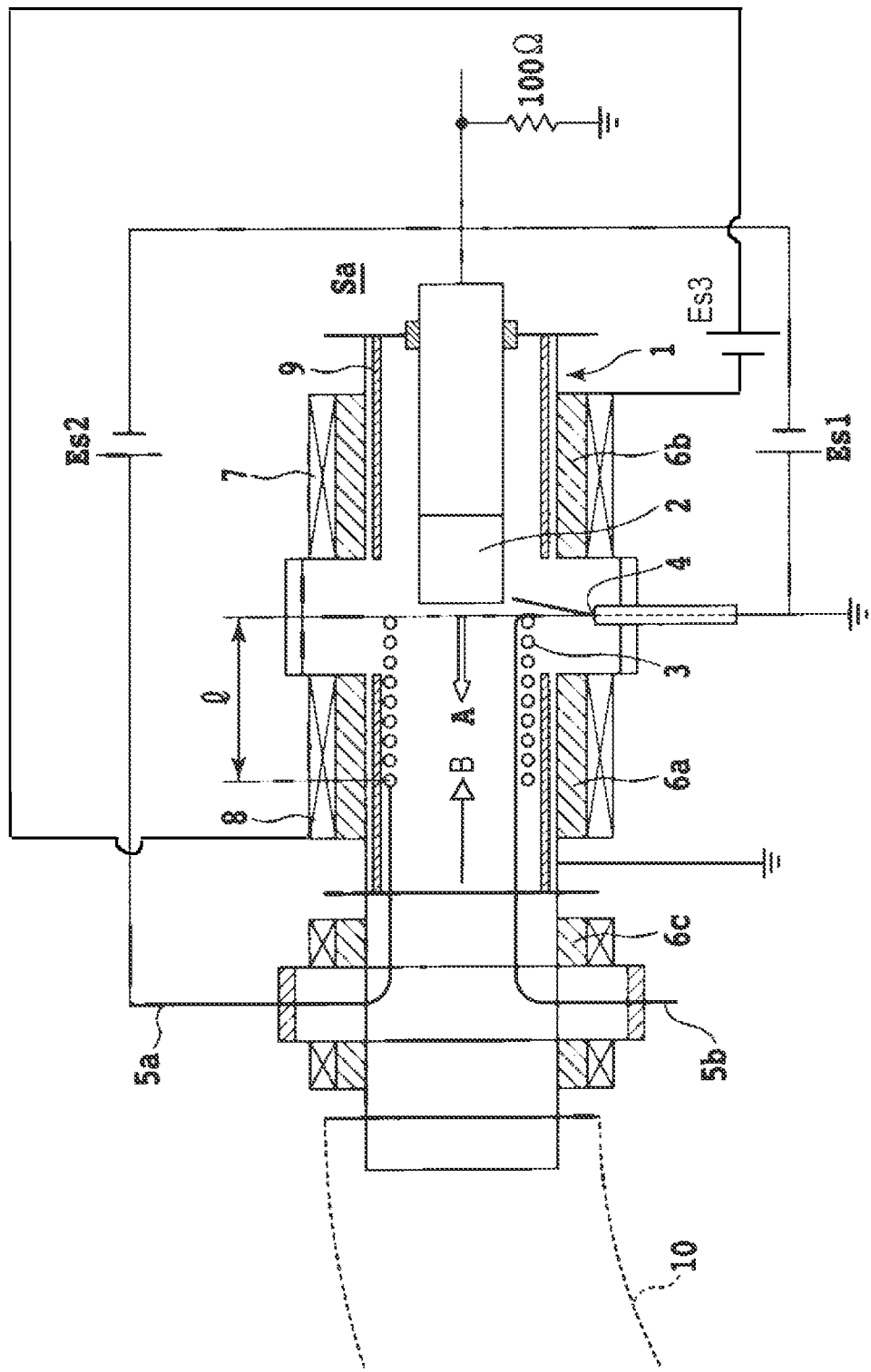
FIG. 2 illustrates a principal part of an embodiment of a vacuum arc evaporation apparatus according to the present invention.

Referring to FIG. 2, the discharge unit can include an arc source discharge vacuum chamber 1 containing the cathode target 2. The discharge vacuum chamber is electrically grounded while the cathode target 2 is electrically ungrounded and made of the deposition material. An anode 3, which is also electrically ungrounded, can be provided as a first generating unit, which can be arranged between the cathode target 2 and the plasma guiding unit 10 to generate a first magnetic field by feeding a current for the arc discharge. The discharge unit can include a unit or means for supplying power for the arc discharge, a unit or means for starting the arc discharge, and a unit or means for generating a second magnetic field as a second generating unit provided around the discharge vacuum chamber. The unit for generating a magnetic field generates the second magnetic field in the discharge vacuum chamber in the direction substantially opposite to the direction of the first magnetic field generated by the anode. This stably maintains the vacuum arc discharge at the arc source when carrying out deposition.

Figure 1:
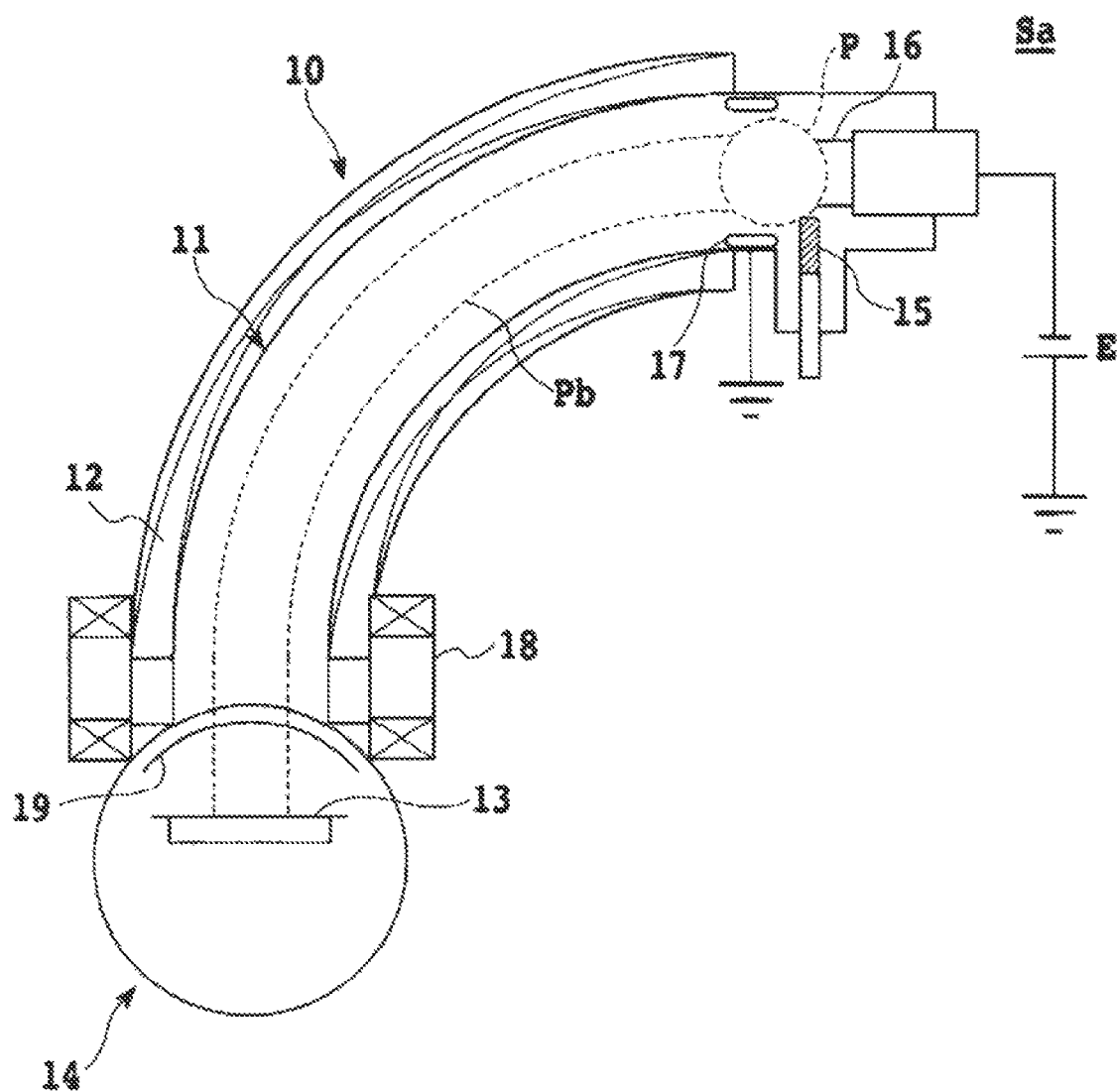
FIG. 1 illustrates an example of an arrangement of a currently used vacuum arc evaporation apparatus.

Note that FIG. 2 illustrates an arrangement of a principal part of an embodiment of a vacuum arc evaporation apparatus according to the present invention. The other part (the part on the left side of a magnetic filter 10 shown in phantom) of the vacuum arc evaporation apparatus can have the same arrangement as that shown in FIG. 1. According to the present apparatus, the arc source Sa can be a cylindrical stainless pipe with an outer diameter of 76 mm and an inner diameter of 70 mm as a main body of the discharge vacuum chamber 1, which is electrically grounded. The cathode target 2 of the arc source Sa can be a cylindrical graphite (carbon) at a purity of 99.999% with a diameter of 30 mm and a length of 30 mm, disposed inside the discharge vacuum chamber 1, while being isolated (not electrically grounded). The cathode target or cathode 2 can be connected to a DC arc power supply Es2. An anode 3 can be a copper tube in having a diameter of 4 mm formed in a coil configuration with a length l of a winding portion being 60 mm and the number of winding of 9 turns, disposed inside the discharge vacuum chamber 1, while being isolated (not electrically grounded). The anode 3 is connected to a DC arc power supply Es2. An arc current flowing in the coil-type anode 3 generates a magnetic field substantially in the direction A toward the anode 3 from the cathode 2.

Still referring to FIG. 2, a striker 4 is provided together with a striker power supply Es1. The striker 4 is in the ground potential and is provided for starting the arc discharge by contacting the surface of the cathode 2. The cathode 2, the anode 3, and the discharge vacuum chamber 1 can be cooled, such as with a cooling fluid or liquid, i.e., water, to prevent overheating when the arc discharge is carried out. For example, copper tubes 5a, 5b can be used to circulate water to cool the anode 3. The copper tube 5a also can be used to connect the anode 3 to the DC arc power supply Es2. Cooling liquid also can be circulated through cooling spaces 6a, 6b, 6c for cooling the arc source vacuum chamber 1. A Helmholtz-coil-type external coil is positioned around the arc source vacuum chamber 1. The Helmholtz-coil-type external coil includes an around-cathode coil 7 and an around-anode coil 8 connected to a DC power supply Es3 for generating a magnetic field in the discharge vacuum chamber 1. Furthermore, between the inner peripheral surface of the arc source vacuum chamber 1 and the anode 3, an insulator 9, such as quartz glass, is disposed.

The magnetic filter 10 (similarly arranged to that shown in FIG. 1) can be an electromagnetic coil with a quarter circular-arc stainless steel pipe, having an outer diameter of 76 mm, an inner diameter of 70 mm and a radius of curvature of 300 mm, taken as a core, on which a polyester covered copper wire having a diameter of 2 mm is wound. The number of turns per unit length of the winding of the electromagnetic coil can be 1000 turns/m.

The vacuum arc deposition apparatus according to the present invention has the magnetic filter 10 and the arc source Sa provided independently of each other. Therefore, the magnetic field generated by the magnetic filter 10 exerts no adverse effect on the maintenance of the arc discharge. In other word, enhancement of transport efficiency of the plasma and maintenance of the plasma discharge can be independently controlled to make it possible to stably maintain the vacuum arc discharge at the arc source for carrying out excellent deposition.

Examples of the vacuum arc evaporation method, carried out by using the vacuum arc evaporation apparatus with the above arrangement, will be explained below.

In the first Example, a magnetic field along a first direction (in the direction of A) is generated at the coil-type anode 3 at about 0.02 T, and an arc discharge was started by operating the striker 4 with a magnetic field of about 0.002 T generated between the cathode 2 and the anode 3 in the direction toward the cathode 2 from the anode 3 (in the direction of B, which is opposite to the first direction A) by feeding a specified current to both the around-cathode coil 7 and the around-anode coil 8 of the Helmholtz-coil-type external coil via the power supply ES3. The arc voltage and current were 30V and 120 A, respectively. After the arc discharge was started by operating the striker 4, even though the voltage of the striker power supply Es1 was then turned off, the arc discharge was stably maintained between the cathode 2 and the anode 3. Furthermore, no cathode spot of the discharge went around the cathode target 2 to allow the carbon plasma to be guided by the magnetic filter 10 to the deposition chamber 14. Thus, a tetrahedral amorphous carbon film can be deposited for a desired time on a substrate to be coated (not shown) in the deposition chamber.

In the second Example, with the apparatus shown in FIG. 2, a test was carried out with a magnetic field of about 0.001 T generated between the cathode 2 and the anode 3 in the direction toward the cathode 2 from the anode 3 (opposite to the direction A) by feeding a current only to the around-cathode coil 7 or to the around-anode coil 8 included in the Helmholtz-coil-type external coil. The other conditions were the same as those in the first Example. In all of the cases, after the arc discharge was started by operating the striker 4, even though the voltage of the striker power supply Es1 was then turned off, the arc discharge was stably maintained between the cathode 2 and the anode 3. Furthermore, no cathode spot of the discharge went around the cathode target 2 to allow the carbon material plasma to be guided by the magnetic filter 10 to the deposition chamber (not shown). Thus, the tetrahedral amorphous carbon film can be deposited for a desired time on the substrate to be coated (not shown) in the deposition chamber.

In the first Comparative Example, in the apparatus shown in FIG. 2, a test was carried out with no current fed to any of the around-cathode coil 7 and the around-anode coil 8 of the Helmholtz-coil-type external coil. The other conditions were the same as those in the first Example. Here, although arc discharge was started by operating the striker 4, however, when the voltage of the striker power supply Es1 was turned off, the arc discharge stopped.

In the second Comparative Example, in the apparatus of FIG. 2, a test was carried out with current fed to both and one of the around-cathode coil 7 and the around-anode coil 8 of the Helmholtz-coil-type external coil, but with the magnetic field generated in the direction toward the anode 3 from the cathode 2 (in the direction A). The other conditions were the same as those in the first Example. Here, in all of the respective cases of feeding current to both of the around-cathode coil 7 and the around-anode coil 8, to only the around-cathode coil 7, and to only the around-anode coil 8, even the starting of the arc discharge was not possible by operating the striker 4.

In the third Comparative Example, in the apparatus of FIG. 2, a test was carried out with the magnetic field generated by feeding current to the Helmholtz-coil-type external coil so that the magnetic field generated by the around-cathode coil 7 and the magnetic field generated by the around-anode coil 8 are in the opposite directions, namely toward each other or away from each other. The other conditions were the same as those in the first Example. Here, in all of the cases, although arc discharge was started by operating the striker 4, however, when the voltage of the striker power supply Es1 was turned off, the arc discharge stopped.

In the third Example, with a vacuum arc deposition method of the first or second Example a disk with a magnetic recording layer was disposed in the deposition vacuum chamber, and an overcoat layer was formed on the disk, by which a magnetic recording medium can be manufactured. The overcoat layer formed this way used graphite (carbon) as the cathode material to therefore permit a formation of a film of a tetrahedral amorphous carbon containing no hydrogen, but rich in $sp^3$ bond carbon and having a high hardness.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP 2003-272059 filed 8 Jul. 2003, in its entirety, including the drawings, claims, and the specification thereof, is incorporated herein by reference.

What is claimed is:

1. A method of depositing a film on to a substrate, with a vacuum arc evaporation apparatus comprising:
   a deposition vacuum chamber;
   a discharge unit having:
      an electrically grounded discharge vacuum chamber;
      an ungrounded cathode target located in the discharge vacuum chamber;
      an ungrounded anode consisting of a first coil having a plurality of continuous windings provided inside the discharge vacuum chamber to generate a first magnetic field;
      a second coil provided outside along and around the discharge vacuum chamber and along and around one of the ungrounded cathode target or the ungrounded anode to generate a second magnetic field; and
      a striker,
      wherein the discharge unit discharges an arc of a material from the ungrounded cathode target to form a cathode-material plasma; and
   a plasma guiding unit entirely disposed downstream of the second coil, between the deposition vacuum chamber and the discharge unit, to guide the cathode-material plasma to the deposition vacuum chamber by an induced magnetic field to deposit the cathode material on to a substrate disposed inside the deposition vacuum chamber,
   the method comprising:
   an evacuating step of evacuating the deposition vacuum chamber containing the substrate;
   a second magnetic field generating step of generating the second magnetic field by feeding current to the second coil;
   an arc starting step of starting the arc discharge by contacting the surface of the ungrounded cathode target with the striker;
   a cathode-material plasma generating step of generating the cathode-material plasma by arc discharging the ungrounded cathode target;
   a first magnetic generating step of generating the first magnetic field by feeding the arc discharge current to the first coil;
   a depositing step of depositing the cathode target on the substrate by guiding the cathode-material plasma to the deposition vacuum chamber with the plasma guiding unit,
   wherein the first magnetic field generating step generates the first magnetic field so that the first magnetic field extends substantially along a first direction, away from the ungrounded cathode target, in a region between the ungrounded cathode target and the ungrounded anode,
   wherein the second magnetic field generating step generates the second magnetic field so that the second magnetic field extends substantially along a second direction, which is substantially opposite to the first direction, toward the ungrounded cathode target, in the region between the ungrounded cathode target and the ungrounded anode, and
   wherein the arc discharge current fed to the first coil is DC current.

2. The method according to claim 1, wherein:
   the first coil is positioned downstream of the ungrounded cathode target, between the plasma guiding unit and the ungrounded cathode target, and
   the direction of the first magnetic field is substantially parallel with the direction of the discharge vacuum chamber.

3. The method according to claim 1, wherein the second coil comprises a Helmholtz coil pair, one of which surrounds part of the first coil and the other of which surrounds the ungrounded cathode target.

4. The method according to claim 1, wherein the current fed to the second coil is DC current.

5. The method according to claim 1, wherein the cathode material is carbon.

6. The method according to claim 1, wherein the substrate has a magnetic recording layer and the cathode material is deposited on the magnetic layer as an overcoat layer.

7. The method according to claim 6, wherein the deposition material is carbon to form the overcoat layer having a tetrahedral amorphous carbon structure with a high hardness.

8. A magnetic recording medium formed by depositing the overcoat layer on the substrate with the magnetic layer according to the method of claim 7.

9. A method of depositing a film on to a substrate, with a vacuum are evaporation apparatus comprising:
　a deposition vacuum chamber;
　a discharge unit having:
　　an electrically grounded discharge vacuum chamber;
　　an electrically ungrounded cathode target located inside the discharge vacuum chamber, wherein the discharge unit discharges an are of a cathode material from the electrically ungrounded cathode target to form a cathode-material plasma;
　　a first field generating unit composed of an electrically ungrounded anode consisting of a first coil provided inside the discharge vacuum chamber to generate a first magnetic field directed in a first direction;
　　a second field generating unit composed of a second coil provided outside along and around the discharge vacuum and along and around one of the electrically ungrounded cathode target or the electrically ungrounded anode to generate a second magnetic field in a second direction, which extends substantially opposite to the first direction; and
　　a striker; and
　a plasma guiding unit entirely disposed downstream of the second coil, between the deposition vacuum chamber and the discharge unit to guide the cathode-material plasma to the deposition vacuum chamber by an induced magnetic field to deposit the cathode material on to a substrate disposed inside the deposition vacuum chamber,
　wherein the electrically ungrounded anode extends along an inner wall of the discharge vacuum chamber and is positioned downstream of the electrically ungrounded cathode target, between the plasma guiding unit and the electrically ungrounded cathode target,
　wherein the electrically ungrounded anode in its entirety is positioned downstream of the electrically ungrounded cathode target,
　wherein the first coil has a plurality of continuous windings, and the direction of a center axis of the first coil is substantially parallel with the direction from the electrically ungrounded cathode target to the first coil, and
　wherein the direction of a center axis of the second coil is substantially parallel with the direction from the electrically ungrounded cathode target to the first coil,
　the method comprising the steps of:
　evacuating the deposition vacuum chamber containing the substrate;
　generating the second magnetic field by supplying current to the second coil so that the second magnetic field extends substantially along the second direction, toward the electrically ungrounded cathode target, in a region between the electrically ungrounded cathode target and the electrically ungrounded anode;
　generating the cathode material plasma by arc discharging the cathode target with the striker;
　generating the first magnetic field by supplying current to the first coil so that the first magnetic field extends substantially along the first direction, away from the electrically ungrounded cathode target, in the region between the electrically ungrounded cathode target and the electrically ungrounded anode; and
　depositing the cathode material on the substrate by guiding the cathode-material plasma to the deposition vacuum chamber with the plasma guiding unit,
　wherein the are discharge current fed to the first coil is DC current.

10. The method according to claim 9, wherein the second coil comprises a Helmholtz coil pair, one of which surrounds part of the first coil and the other of which surrounds the electrically ungrounded cathode target.

11. The method according to claim 9, wherein the current fed to the second coil is DC current.

12. The method according to claim 9, wherein the cathode material is carbon.

13. The method according to claim 9, wherein the substrate has a magnetic recording layer and the cathode material is deposited on the magnetic layer as an overcoat layer.

14. The method according to claim 13, wherein the cathode material is carbon to form the overcoat layer having a tetrahedral amorphous carbon structure with a high hardness.

15. A magnetic recording medium formed by depositing the overcoat layer on the substrate with the magnetic layer according to the method of claim 14.

\* \* \* \* \*

UNITED STATES PATENT AND TRADEMARK OFFICE
CERTIFICATE OF CORRECTION

PATENT NO.        : 8,500,967 B2
APPLICATION NO.   : 13/172272
DATED             : August 6, 2013
INVENTOR(S)       : Naruhisa Nagata It is certified that error appears in the above-identified patent and that said Letters Patent is hereby corrected as shown below:

On the Title Page:

IN THE ABSTRACT:

In line 1, replace "are" with --arc--;

In line 5, replace "are" with --arc-- both occurrences; and

In line 7, replace "are" with --arc--.

IN THE CLAIMS:

In claim 1, col. 5, line 62 and col. 6, lines 10, 30, 33, replace "are" with --arc--; and In claim 9, col. 7, lines 11, 17 and col. 8, line 28, replace "are" with --arc--.

Signed and Sealed this
Twenty-second Day of October, 2013

Teresa Stanek Rea
*Deputy Director of the United States Patent and Trademark Office*